(12) United States Patent
Sogard (10) Patent No.: US 6,215,642 B1
(45) Date of Patent: Apr. 10, 2001

(54) VACUUM COMPATIBLE, DEFORMABLE ELECTROSTATIC CHUCK WITH HIGH THERMAL CONDUCTIVITY

(75) Inventor: Michael Sogard, Menlo Park, CA (US)

(73) Assignee: Nikon Corporation of Japan, Tokyo (JP)

( * ) Notice: Subject to any disclaimer, the term of this patent is extended or adjusted under 35 U.S.C. 154(b) by 0 days.

(21) Appl. No.: 09/266,705

(22) Filed: Mar. 11, 1999

(51) Int. Cl.[7] .................................................. H02N 13/00
(52) U.S. Cl. .............................................................. 361/234
(58) Field of Search ................................ 361/233–235; 279/128

(56) References Cited

U.S. PATENT DOCUMENTS

| | | |
|---|---|---|
| 3,993,509 | 11/1976 | McGinty . |
| 4,184,188 | 1/1980 | Briglia . |
| 4,384,918 | 5/1983 | Abe . |
| 4,551,192 | * 11/1985 | Di Milia et al. ................... 156/345 |
| 5,532,903 | 7/1996 | Kendall . |
| 5,583,736 | * 12/1996 | Anderson et al. ................. 361/234 |
| 5,764,471 | * 6/1998 | Burkhart ........................... 361/234 |
| 5,777,838 | * 7/1998 | Tamagawa et al. ............... 361/234 |
| 5,851,641 | * 12/1998 | Matsunaga et al. .............. 361/234 |
| 5,883,778 | * 3/1999 | Shersinsky et al. ............... 361/234 |

OTHER PUBLICATIONS

Low Temperture Etch Chuck Modeling and Experimental Results of Heat Transfer and Wafer Temperature; pp. 1065, 1066,1067,1068 and 1070. Written by: D.R. Wright, D.C. Hartman and U.C. Sridharan and published in the Journal of Vacuum Science and Technology, A10, 1065 (1992).

* cited by examiner

Primary Examiner—Michael J. Sherry
(74) Attorney, Agent, or Firm—Beyer Weaver & Thomas, LLP (57) ABSTRACT

A vacuum compatible, deformable electrostatic chuck with high thermal conductivity including a membrane having a layer of dielectric material, a layer of metallic film and a layer of semiconductor material with struts and a rim formed on the layer of semiconductor material. The rim is formed on the periphery of the layer of semiconductor material. The rim and struts contact a surface of a supporting structure forming a hollow area in which a coolant gas may be circulated. The supporting structure has gas manifold holes to connect the hollow area with a source of coolant gas. In a first embodiment, the struts have a rectangular cross section and are formed as a continuous structure from a first point on the rim to a second point on the rim. In a second embodiment, the struts are flexure struts having a first section with a rectangular cross section and a second section formed as a truncated cone or a pyramid.

17 Claims, 8 Drawing Sheets

VACUUM COMPATIBLE, DEFORMABLE ELECTROSTATIC CHUCK WITH HIGH THERMAL CONDUCTIVITY

FIELD OF THE INVENTION

This invention relates generally to electrostatic chucks used in a manufacturing process for patterning and processing substrates such as semiconductor chips and wafers. More specifically, this invention relates to electrostatic chucks that can be used in high vacuum applications for patterning and processing substrates. Even more specifically, this invention relates to electrostatic chucks that reduce both in-plane and out-of-plane distortion of the substrate being processed.

BACKGROUND OF THE INVENTION

Typically, there are two types of chucks that are used in semiconductor processing of substrates such as a wafer or a mask. The first type of chuck is known as a vacuum chuck, which employs a vacuum to hold the substrate in place against the chuck. The second type of chuck is known as an electrostatic chuck, which applies an electric potential between the substrate and the chuck to secure the substrate in place on the chuck during patterning of the substrate, or, in the case where the substrate is a mask, during patterning of a chip or wafer or the like with the chucked mask. Electrostatic chucks utilize the attractive force between the two plates of a capacitor to hold the wafer in place. If the wafer is separated from a parallel electrode by an insulator of dielectric constant $\epsilon$ and thickness d, and a voltage V applied between them, an attractive force F is generated between them as follows:

$$F=(\epsilon V^2/2d^2)A$$

where A is the common area of the wafer and electrode. Clearly the maximum force is achieved by using a thin dielectric layer with a high dielectric constant. The electric potential is maintained during processing such that the chucked substrate or mask is held in place with a precisely maintained and controlled position. After patterning, the chucked substrate or mask can simply be removed by disconnecting the electric potential. A third type of chuck uses mechanical clamps to hold the wafer in place. However, the risks of damage to the patterned wafer and particle generation increasingly discourage the use of mechanical clamps.

The use of electrostatic chucks is the preferred method in vacuum systems, where vacuum chucks are obviously not applicable. For high resolution lithography applications a serious problem is caused by particles trapped between the wafer and the top surface of the chuck, because the particles can distort the top surface of the wafer, leading to distortions in the developed image in the resist coating on the wafer. In vacuum chucks, this problem is minimized by forming the top surface of the chuck like a "bed of nails," leading to a very low fraction of the surface of the chuck contacting the wafer. The result of this method is that the probability of a particle lying directly between the wafer and a contacting part of the chuck is small.

The "bed of nails" solution for an electrostatic chuck is difficult. The separation between the wafer and electrode d must exceed the largest particle anticipated, putting a lower limit on d. Also, assuming the dielectric makes up the "nails," the effective dielectric constant is reduced. If the nails represent a fraction f of the area of the wafer, then the effective dielectric constant is $f\epsilon+(1-f)$, since the dielectric constant of free space is 1. If, for example, $\epsilon=3$ and $f=0.05$, the effective dielectric constant for the "bed of nails" is 1.1 rather than 3. Thus, the hold down force is significantly lower for the "bed of nails."

Another problem associated with vacuum operation is that it is difficult to conduct heat away from the substrate as it is heated by the exposing radiation. The normal construction of wafer chucks is not conducive to efficient heat transfer. Also, for some electron-beam lithography applications, electron optics considerations require the substrate and its local environment to be immersed in a magnetic field. If the substrate chuck is mounted on a stage which moves during exposure, and if the chuck or stage is constructed of materials with high electrical conductivity, aside from very thin conducting films, eddy currents can be generated which will perturb the magnetic fields and possibly disturb the exposure process. This requires that the chuck and stage be manufactured from non-conducting materials, such as ceramic materials. However, these materials typically have low thermal conductivity.

In some applications where precise locations of features on the wafer are important, such as lithography applications, the wafer may absorb enough heat to cause local thermal displacements, or distortions, of the features on the wafer. These displacements may be enough to create overlay errors between different layers of patterns on the wafer. In conventional vacuum chucks, the hold-down force has been sufficiently large so far to prevent these displacements. This may not be true for electrostatic chucks. The wafer then may expand, and as it expands it may break loose from the chuck locally and slip on the surface of the chuck. This "stiction" can cause unpredictable location errors. In principle, the thermally induced wafer distortions can be predicted, and corrections can be applied to the lithography imaging system. However, if stiction is present, the timing and amount of the displacements can not be accurately predicted.

Accordingly, there is a need for electrostatic chucks that are vacuum compatible, tolerant of particles, have high thermal conductivity, and avoid problems caused by stiction.

SUMMARY OF THE INVENTION

The present invention overcomes the above problems associated with electrostatic chucks and provides other additional advantages with a vacuum compatible, deformable electrostatic chuck with high thermal conductivity. The electrostatic chucks of the present invention have a thin membrane formed of a first layer of a dielectric material, a second layer of a metallic film and a third layer of a semiconductor substrate material having a rim and multiple struts formed on the third layer. The membrane is attached to a supporting structure by the rim and the struts, providing a hollow area between the membrane and a surface of the supporting structure.

In accordance with an aspect of the invention, the supporting structure has gas manifold holes connecting the hollow area between the membrane and the surface of the supporting structure with a source of coolant gas.

In accordance with another aspect of the invention, the supporting structure has a hollow region with a top surface within the hollow region having grooves. The hollow area is filled with a coolant liquid.

In accordance with a first embodiment of the present invention, the multiple struts are formed on the third layer from first points on the rim to second points on the rim.

In accordance with a second embodiment of the present invention, the multiple struts are flexural struts and are formed at multiple locations on the third layer.

These and other advantages of the present invention will become more apparent upon a reading of the detailed description of the preferred embodiment or embodiments that follow, when considered in conjunction with the drawings of which the following is a brief description. It should be clear that the drawings are merely illustrative of the currently preferred embodiments of the present invention, and that the invention is in no way limited to the illustrated embodiment. As will be realized, the invention is capable of other embodiments and its several details are capable of modifications in various obvious aspects, all without departing from the scope of the invention. The present invention is best defined by the claims appended to this specification.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

The following detailed description is of the presently preferred embodiment of the present invention. It is to be understood that while the detailed description is given utilizing the drawings briefly described above, the invention is not limited to the illustrated embodiment. In the detailed description, like reference numbers refer to like elements.

Referring now to the Figures, the several embodiments of the present invention will now be described.

FIGS. 1A–1I show the details of making and using an electrostatic chuck in accordance with a first embodiment of the present invention. FIGS. 2A–2I show the details of making and using an electrostatic chuck in accordance with a second embodiment of the present invention.

The electrostatic chucks of the first and second embodiments have a largely deformable surface that avoids problems caused by particulates trapped between the chuck and a substrate electrostatically clamped to the chuck. This is not true of course if a particle lies directly over a strut. However, like the "bed of nails" chuck, the struts cover only a small fraction of the wafer area, so the probability of this occurring is small. The chucks are hollow and vacuum tight. The interiors of the chucks can be filled with a coolant gas to conduct heat away from the substrate. An example of a coolant gas that can be used is helium at sub-atmospheric pressure that can transfer heat efficiently from the surface in contact with the substrate and a heatsink in contact with a coolant.

As is known, the thermal conductivity k of a gas is essentially independent of pressure as long as the mean free path of the gas molecules is small compared to the system dimensions. This is discussed in more detail below. This fact allows using a gas at a relatively low pressure in the chuck with little effect on the heat transfer. The relatively low pressure avoids distorting the membrane of the chuck. A large deformation would reduce the area of contact between the distorted membrane and the flat wafer, and it might weaken the membrane.

The electrostatic chuck of the first embodiment includes struts that support the membrane and provide a uniform xy plane. The electrostatic chuck of the second embodiment includes flexure struts that avoid problems caused by stiction. This is achieved by a membrane that is supported by flexural struts. Because the dielectric material formed on the membrane is in intimate contact with the substrate and has very little heat capacity because of its thinness, the membrane's temperature will follow that of the bottom of the wafer. If the thermal expansion coefficient of the membrane is similar to that of silicon, the membrane will expand with the substrate and no differential or relative motion between the membrane and the substrate will occur; thus, no problems caused by stiction will occur. However, the membrane will move relative to the base of the chuck where the struts from the membrane are attached. In the second embodiment, the struts are attached to the base through flexural connections, so they can flex laterally as the membrane moves. These struts are stiff in the vertical direction so they provide a rigid base for the wafer. Some fraction of the struts, near an edge of the wafer, may remain laterally stiff, without flexural freedom, so that the wafer tends to move relative to this region. This provides a fixed point from which corrections to the location of the lithographic patterning may be determined.

A deformable membrane conveys another advantage with respect to the effects of local heating of the wafer. The energy of the exposing radiation is absorbed primarily in the upper part of the wafer, leading to a vertical temperature gradient across the thickness of the wafer. This temperature gradient causes the upper surface of the wafer to expand more than the bottom surface. In the absence of any wafer chuck clamping force, this differential expansion would cause the wafer to assume a concave shape as seen from the bottom side of the wafer. The presence of chuck clamping forces would oppose such a deformation, but if they are not strong enough the wafer will break loose locally from the chuck surface, if the chuck surface is not deformable. As the wafer cools locally, or the vertical temperature gradient is reduced, the wafer will again flatten out locally and re-contact the chuck surface. However, if expansive forces are present from heating of an adjacent region of the wafer, relative motion of the wafer bottom and the chuck may occur, leading to stiction effects. The deformable membrane chuck can maintain strong contact with the wafer surface bottom even during this deformation. Therefore, even in this situation stiction effects are much less likely with the membrane chuck.

Figure 1A:
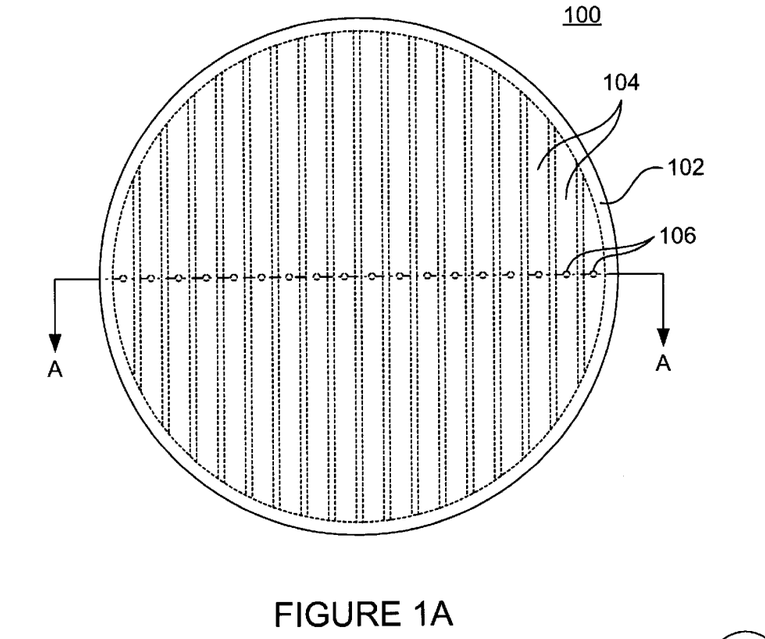
FIG. 1A is a plan view of a portion of a first embodiment of an electrostatic chuck in accordance with the present invention.

FIG. 1A is a plan view of an electrostatic chuck 100 in accordance with a first embodiment of the present invention. The electrostatic chuck 100 includes a rim 102 around the periphery of the electrostatic chuck 100 and a number of struts, two of which are indicated at 104. The struts 104 are continuous structures extending from a first point on the rim 102 to a second point on the rim 102. Also shown are gas manifold holes, two of which are indicated at 106. It should be appreciated that the gas manifold holes 106 are in the supporting structure that supports the electrostatic chuck 100 and will be discussed below.

The gas manifold holes 106 allow gas to be supplied between the wafer chuck membrane and base and to control the gas pressure. It is possible to place manifold holes at opposite ends of the channels formed by the struts 104. Gas could then flow continuously between wafer chuck membrane and base, increasing the heat transfer capability of the chuck. However, given the low pressure of the gas, and its corresponding low specific heat capacity, it is unlikely the increase would be enough to justify the additional complexity of gas flow and pressure control.

Figure 1B:
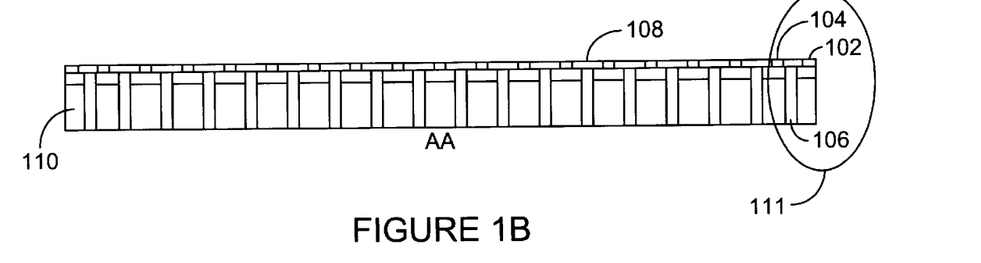
FIG. 1B is a side view of the electrostatic chuck shown in FIG. 1A.

FIG. 1B is a side view of Section AA of the electrostatic chuck 100 as shown in FIG. 1A. A membrane 108 is shown overlaying the struts 104. The gas manifold holes 106 are shown extending through a supporting structure 110, which will be shown in more detail below. A portion of the electrostatic chuck 100 is shown encircled at 111 and is shown enlarged in FIG. 1C.

Figure 1C:
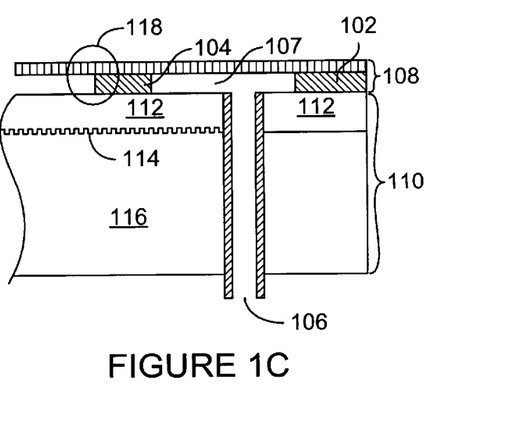
FIG. 1C is an expanded view of a portion of the side view of the electrostatic chuck as indicated in FIG. 1B.

FIG. 1C is an enlarged view of the portion of the electrostatic chuck 100 indicated at 111 in FIG. 1B. The membrane 108, which includes the struts 104 and the rim 102, is connected to the top layer 112 of a supporting structure 110 by the struts 104 and rim 102. A hollow area 107 is formed between the top surface of the top layer 112 and the membrane 108. Gas manifold hole 106 is shown extending through portions of the supporting structure 110. The supporting structure 110 includes the portion 112 that could be made from a wafer. The wafer is thinned and can have a bottom surface micromachined with small grooves 114 that facilitate heat transfer to a coolant liquid that fills a hollow portion 116 of the supporting structure 110. A portion of the membrane 108 is encircled at 118 and is shown enlarged in FIG. 1D.

Figure 1D:
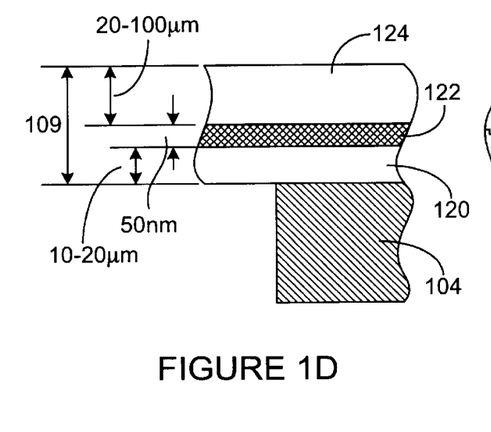
FIG. 1D is an expanded view of a portion of the membrane, metallic layer and dielectric layer as indicated in FIG. 1C.

FIG. 1D is an enlarged view of the portion of the membrane 108 indicated at 118 in FIG. 1C. The membrane 108 includes layer 120 that can be made from a semiconductor substrate such as a semiconductor wafer. The method of making the membrane 108 is discussed below. The thickness of layer 120 is typically 10–20 $\mu$m. A layer 122 of a metallic film is formed on the surface of layer 120. The metallic film 122 is a conductive layer and can be made of aluminum, tungsten or any conductive material typically used in the manufacture of semiconductor integrated devices. The metallic film 122 can have a thickness of about 50 nanometers. A layer 124 of a dielectric material is formed on the layer 122 of metallic film. The layer 124 of dielectric material is typically made from a material such as silicon dioxide ($SiO_2$), sapphire or organic polymer. The layer 124 can have a thickness in the range of 20–100 $\mu$m. The relatively small total thickness of approximately 0.12 mm of the membrane, indicated at 109 allows the membrane 108 to be deformable. The above thicknesses are provided as an example only, and it should be appreciated that other thicknesses could be used.

Figure 1E:
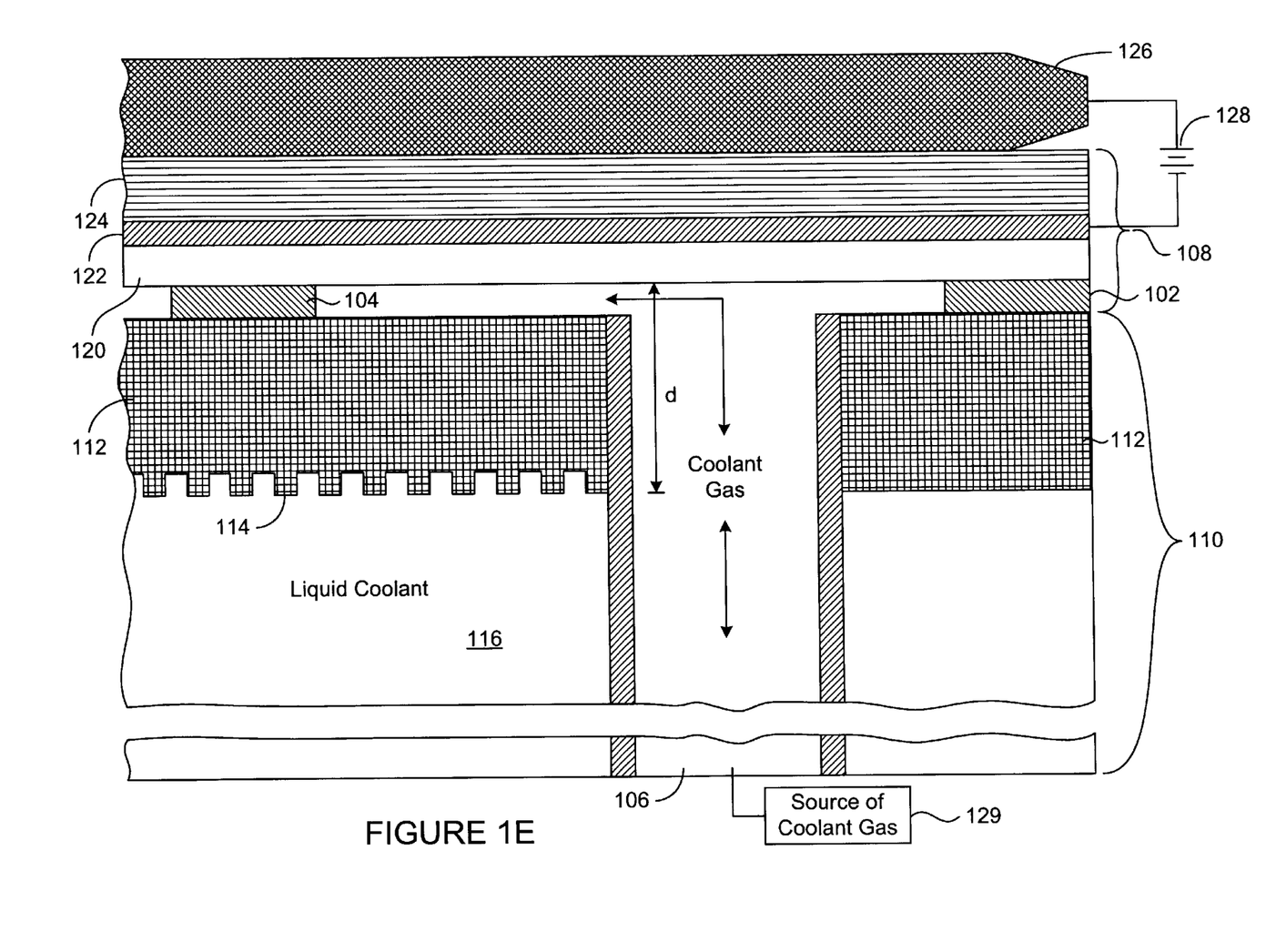
FIG. 1E is an enlarged view of a portion of the side view of the electrostatic chuck shown in FIG. 1C.

FIG. 1E is an enlarged view of the portion of the side view of the portion of the electrostatic chuck 100 as shown in FIG. 1C. The supporting structure 110 is shown with a liquid coolant in portion 116 of the supporting structure 110. The membrane 108 which includes layer 124, layer 122 and layer 120 and the struts 104 and rim 102 is connected to the layer 112 of the supporting structure 110. A wafer (substrate) 126 is shown electrostatically chucked to the membrane 108. The electric potential is applied to the layer of metallic film 122 and to the wafer 126 as represented by the battery 128. The membrane 108 is permanently attached to the structure 112 at the rim 102 and at the struts 104. The gas manifold holes 106 connect the hollow area 107 to a source of coolant gas 129. The pressure of the coolant gas is controlled to be a small fraction of atmospheric pressure, to avoid deforming the membrane 108.

Figure 1F:
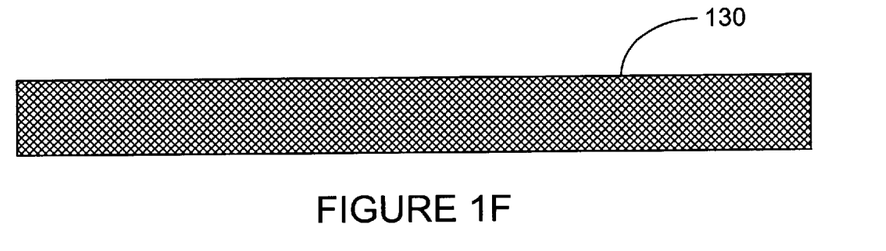
FIGS. 1F–1I illustrate a method of forming the membrane, metallic layer and dielectric layer in accordance with the first embodiment of the present invention.
Figure 1G:
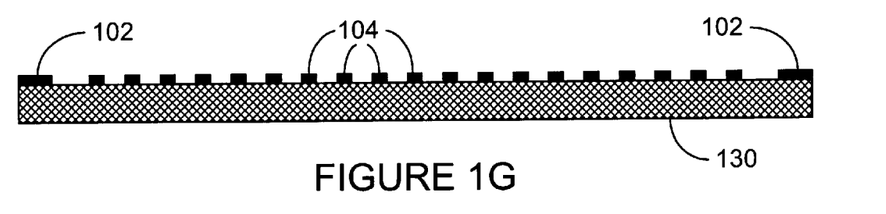
Figure 1H:
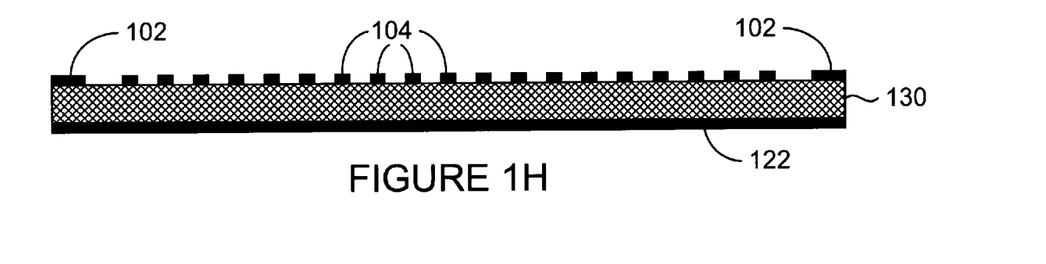
Figure 1I:
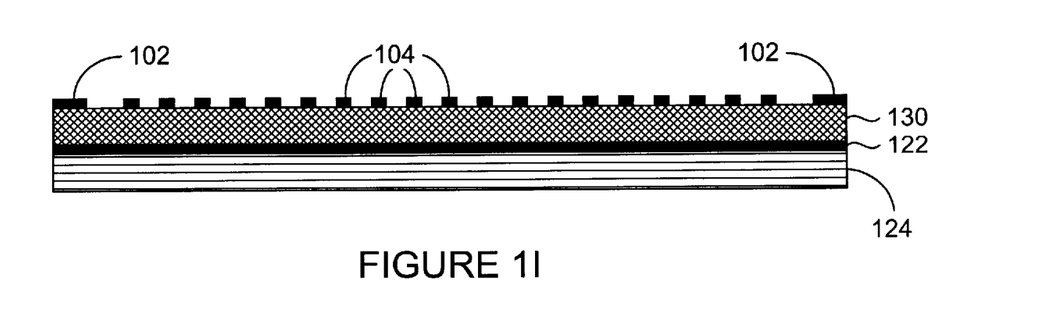

FIGS. 1F–1I show a method of manufacturing the membrane 108. FIG. 1F shows a cross section of a blank semiconductor wafer 130. The blank semiconductor wafer 130 is etched to form the struts 104 and the rim 102 on the semiconductor wafer 130 as shown in FIG. 1G. It should be noted that the thickness of the wafer 130 is substantially reduced and is referred to in FIGS. 1D and 1E layer 120. FIG. 1H shows a layer of metallic film 122 formed on the wafer 130. FIG. 1I shows a layer 124 of dielectric material formed on the layer of metallic film 122. The substrate 112 may be formed by similar techniques from a silicon wafer. The substrate and membrane can be attached by epoxy or anodic bonding.

Figure 2A:
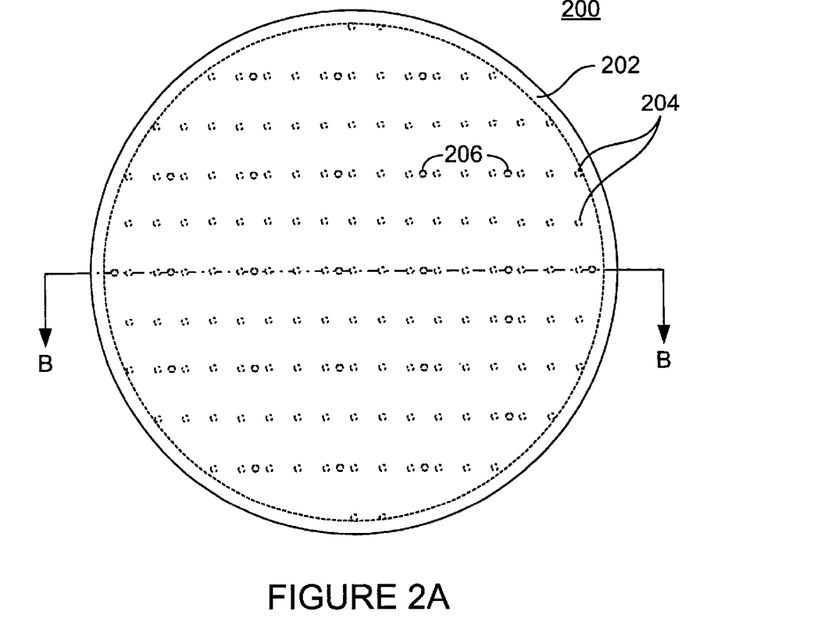
FIG. 2A is a plan view of a second embodiment of an electrostatic chuck in accordance with the present invention.

FIG. 2A is a plan view of an electrostatic chuck 200 in accordance with a second embodiment of the present invention. The electrostatic chuck 200 includes a rim 202 around the periphery of the electrostatic chuck 200 and a number of square shaped struts, two of which are indicated at 204. The struts 204 have a first section having a rectangular cross section and a second section having tapered sides as shown in cross section. The second section can be a truncated cone to provide flexure in all directions. The second section can also be pyramidal shape to provide flexure in all directions. The struts 204 could have a tapered section at both ends for additional flexing. Also shown are gas manifold holes, two of which are indicated at 206. It should be appreciated that the gas manifold holes 206 are in the supporting structure that supports the electrostatic chuck 200 and will be discussed below.

Figure 2B:
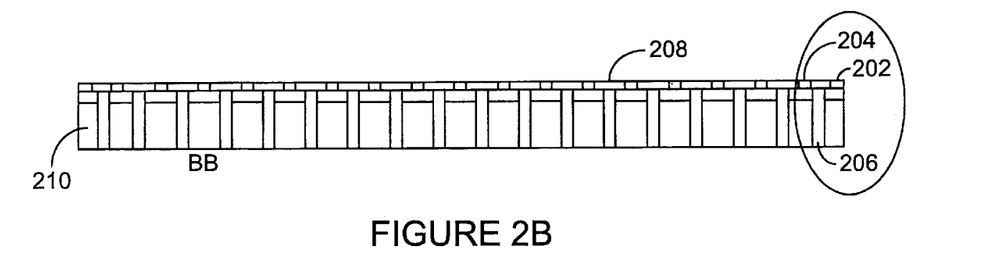
FIG. 2B is a side view of the electrostatic chuck shown in FIG. 2A.

FIG. 2B is a side view of Section BB of the electrostatic chuck 200 as shown in FIG. 2A. A membrane 208 is shown overlaying the struts 204. The gas manifold holes 206 are shown extending through a supporting structure 210, which will be shown in more detail below. A portion of the electrostatic chuck 200 is shown encircled at 211 and is shown enlarged in FIG. 2C.

Figure 2C:
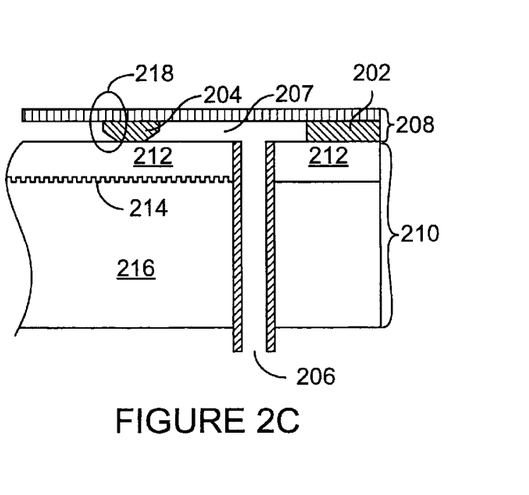
FIG. 2C is an expanded view of a portion of the side view of the electrostatic chuck as indicated in FIG. 2B.

FIG. 2C is an enlarged view of the portion of the electrostatic chuck 200 indicated at 211 in FIG. 2B. The membrane 208, which includes the struts 204 and the rim 202, is connected to the top layer 212 of a supporting structure 210 by the struts 204 and rim 202. A hollow area 207 is formed between the top surface of the top layer 212 and the membrane 208. The gas manifold hole 206 is shown extending through portions of the supporting structure 210. The supporting structure 210 includes a portion 212 that could be made from a wafer. The wafer is thinned and can have a bottom surface micromachined with small groves 214 that facilitate heat transfer to a coolant liquid that fills a hollow portion 216 of the supporting structure 210. A portion of the membrane 208 is encircled at 218 and is shown enlarged in FIG. 2D.

Figure 2D:
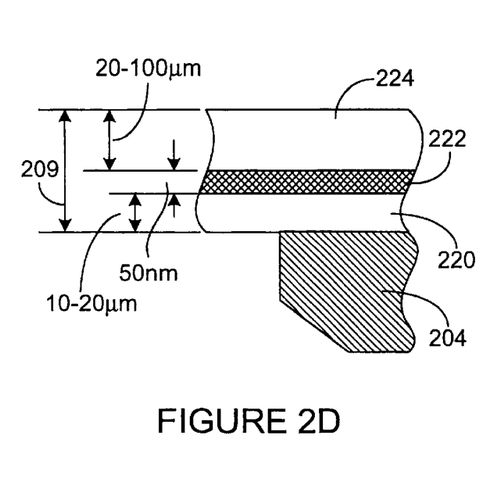
FIG. 2D is an expanded view of a portion of the membrane, metallic layer and dielectric layer as indicated in FIG. 2C.

FIG. 2D is an enlarged view of the portion of the membrane 208 indicated at 218 in FIG. 2C. The membrane 208 includes layer 220 that can be made from a semiconductor substrate such as a semiconductor wafer. The method of making the membrane 208 is discussed below. The thickness of layer 220 is typically 10–20 $\mu$m. A layer 222 of a metallic film is formed on the surface of layer 220. The metallic film 222 is a conductive layer and can be made of aluminum, tungsten or any conductive material typically used in the manufacture of semiconductor integrated devices. The metallic film 222 has a thickness of about 50 nanometers. A layer 224 of a dielectric material is formed on the layer 222 of metallic film. The layer 224 of dielectric material is typically made from a material such as silicon dioxide ($SiO_2$), sapphire or organic polymer. The layer 224 has a thickness in the range of 20–100 $\mu$m. The relatively small total thickness of approximately 0.12 mm of the membrane 209 allows the membrane 209 to be deformable. The above thicknesses are provided as an example only, and it should be appreciated that other thicknesses could be used.

Figure 2E:
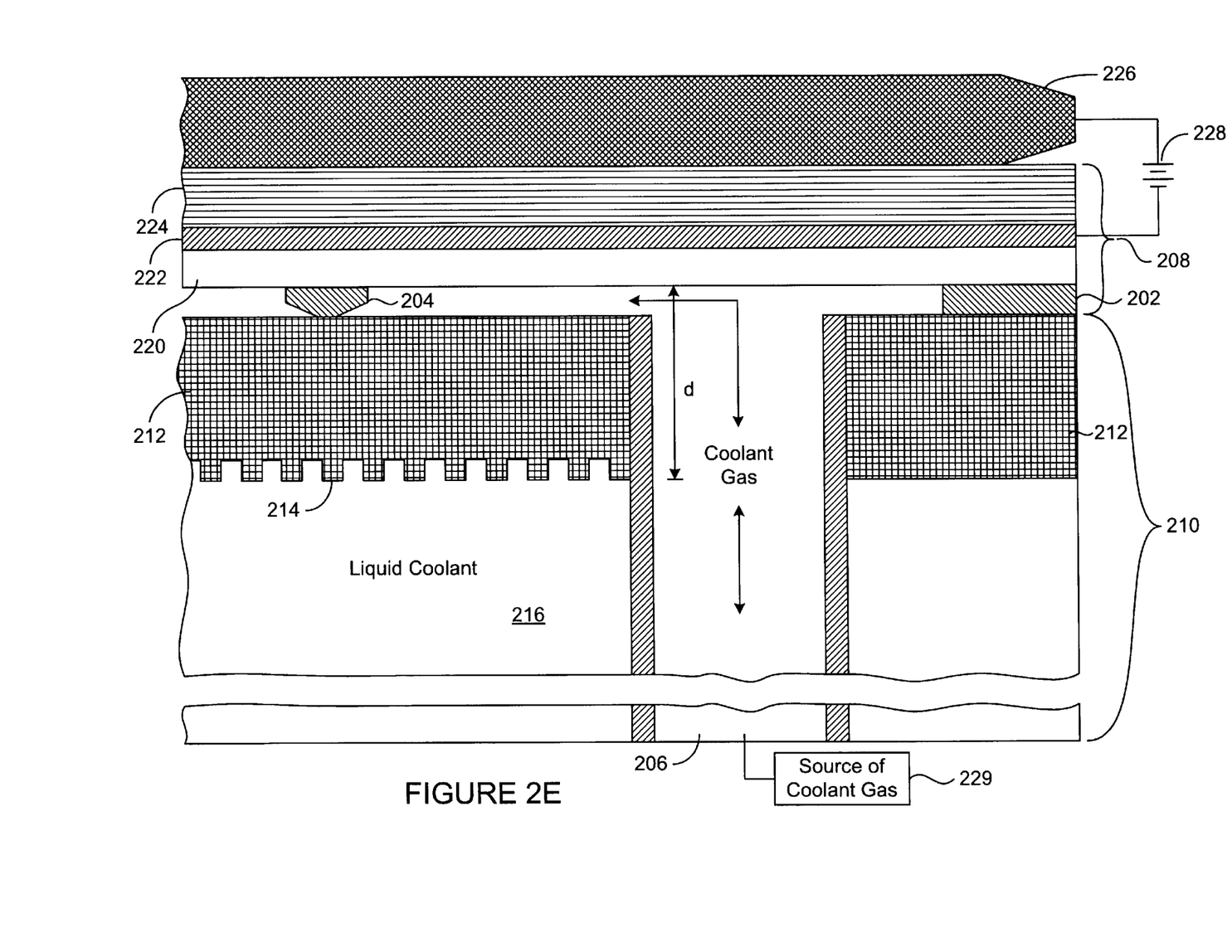
FIG. 2E is an enlarged view of a portion of the side view of the electrostatic chuck shown in FIG. 2C.

FIG. 2E is an enlarged view of the portion of the side view of the portion of the electrostatic chuck 200 as shown in FIG. 2C. The supporting structure 210 is shown with a liquid coolant in portion 216 of the supporting structure 210. The membrane 208 which includes layer 224, layer 222 and layer 220 and the struts 204 and rim 202 is connected to the layer 212 of the supporting structure 210. A wafer (substrate) 226 is shown electrostatically chucked to the membrane 208. The electric potential is applied to the layer of metallic film 222 and to the wafer 226 as represented by the battery 228. The membrane 208 is permanently attached to the structure 212 at the rim 202 and struts 204. The gas manifold holes 206 connect the hollow area 207 to a source of coolant gas 229.

Figure 2F:
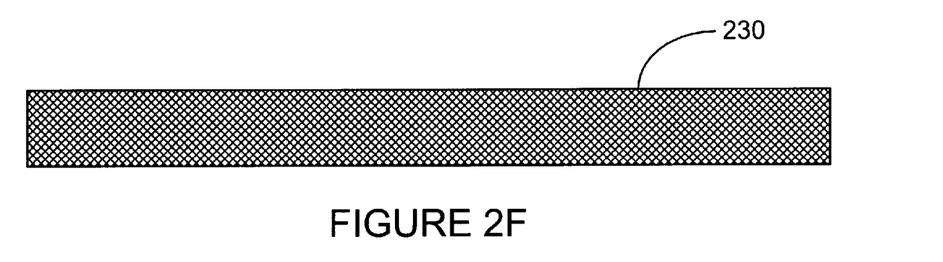
FIGS. 2F–2I illustrate a method of forming the membrane, metallic layer and dielectric layer in accordance with the second embodiment of the present invention.
Figure 2G:
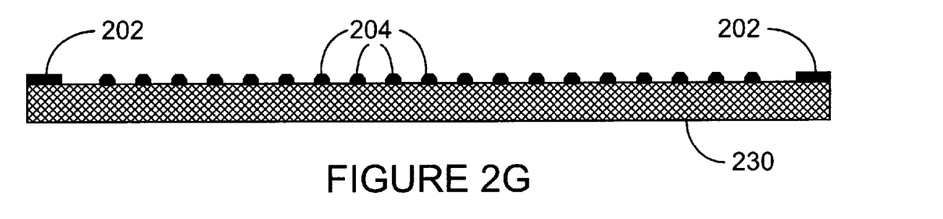
Figure 2H:
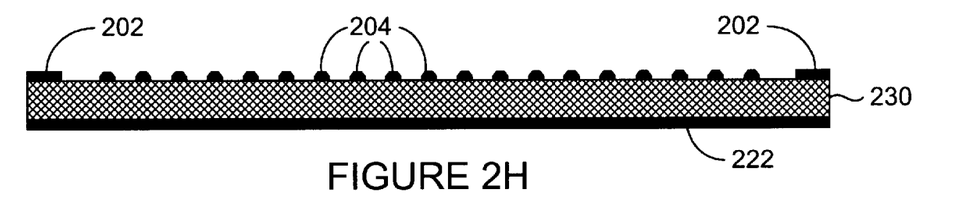
Figure 2I:
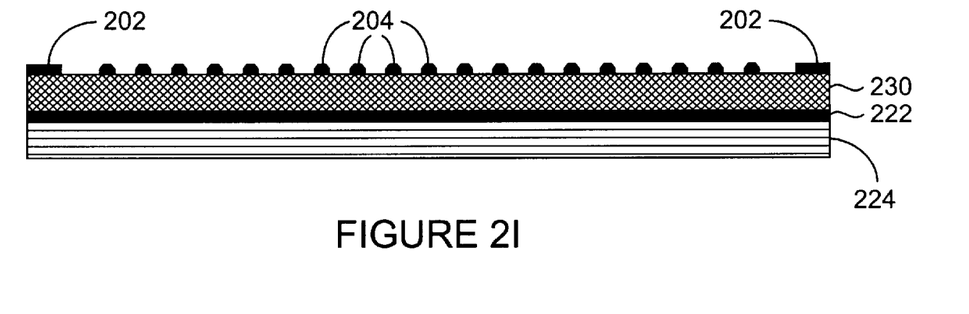

FIGS. 2F–2I show a method of manufacturing the membrane 208. FIG. 2F shows a cross section of a blank semiconductor wafer 230. The blank semiconductor wafer 230 is etched to form the flexure struts 204 and the rim 202 on the semiconductor wafer 230 as shown in FIG. 2G. It should be noted that the thickness of the wafer 230 is substantially reduced and is referred to in FIGS. 2D and 2E layer 220. FIG. 2H shows a layer of metallic film 222 formed on the wafer 230. FIG. 2I shows a layer 224 of dielectric material formed on the layer of metallic film 222.

Figure 3A:
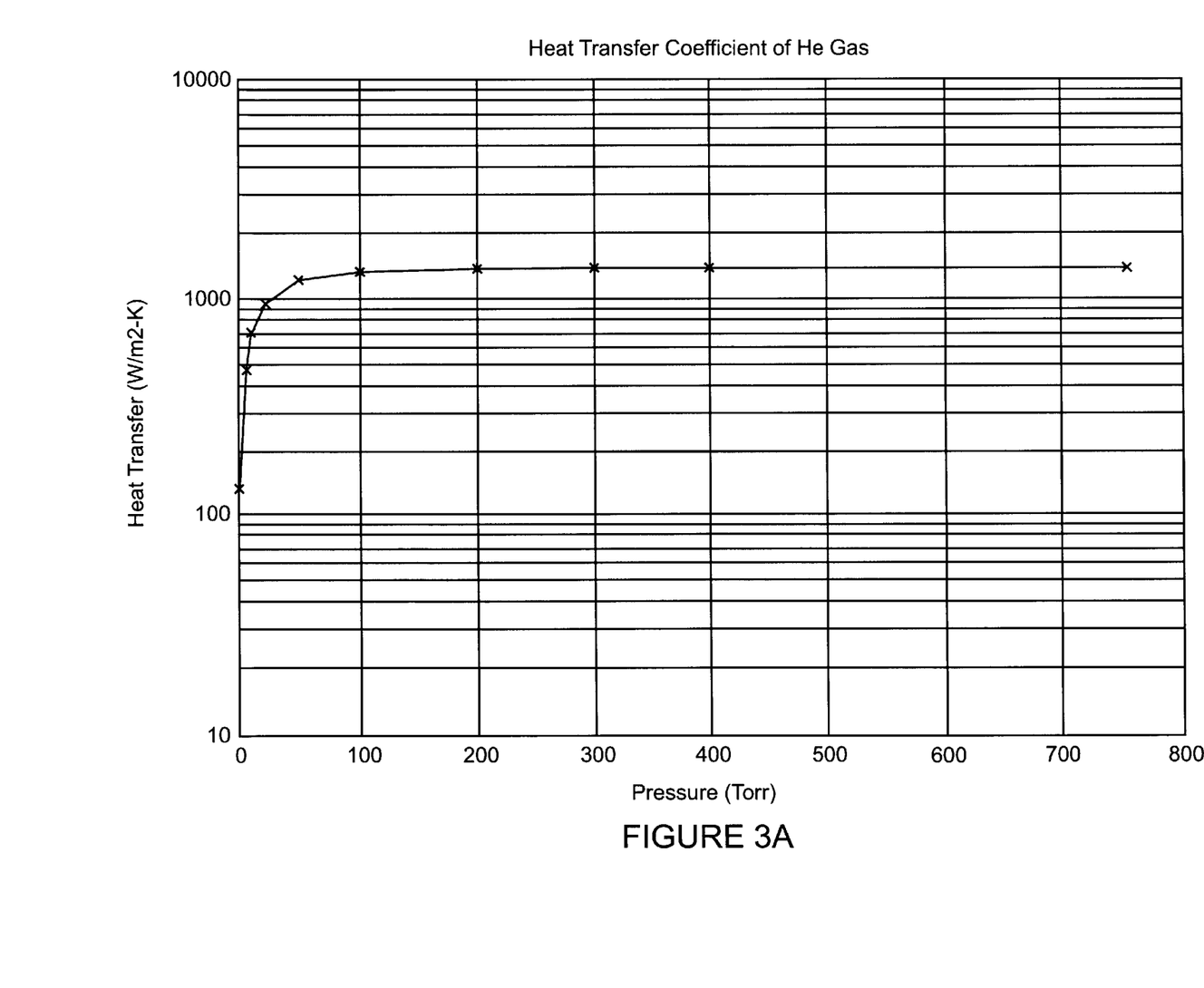
FIGS. 3A & 3B show the heat transfer coefficient of helium gas as a function of pressure and distance between wafer chuck membrane and base.
Figure 3B:
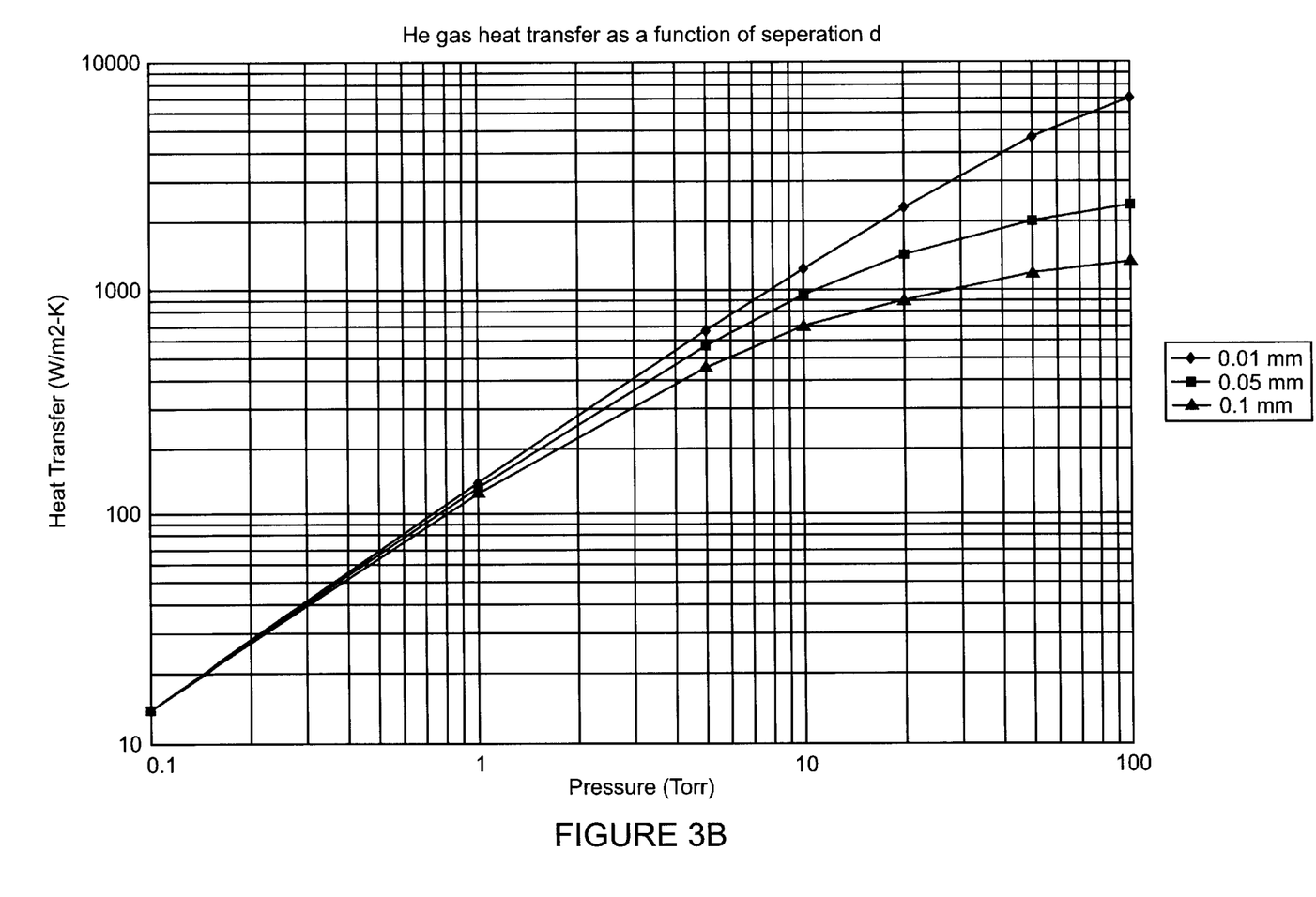

FIG. 3A shows the heat transfer coefficient of He gas as a function of pressure for two parallel surfaces separate by distance d=100 $\mu$m. FIG. 3A is based on expressions from the paper "Low temperature etch chuck: modeling and experimental results of heat transfer and wafer temperature," by D. Wright et al., published in Journal of Vacuum Science and Technology, A10, 1065 (1992). As can be seen, the heat transfer coefficient decreases by only about 15% as the pressure decreases from an atmospheric pressure of 760 Torr to about 50 Torr, which is about 6% of atmospheric pressure. At 50 Torr, the mean free path in He at a temperature of 25° C. is about 2.9 $\mu$m, which is a small fraction of the separation d. However, the heat transfer of the gas is a function of the dimensions of the chuck. If the distance between the membrane surface and the base of the chuck is d, FIG. 3B shows the heat transfer of He for several values of d. As can be seen, a small value of d enhances the heat transfer. For example, at a pressure of 100 Torr and a separation of d=100 $\mu$m, the heat transfer is about 1305 W/$m^2$-° K, which is about 8% less than its value at atmospheric pressure.

In summary, the results and advantages of an electrostatic chuck of the present invention can now be more fully realized. The electrostatic chuck of the present invention provides a vacuum compatible, deformable electrostatic chuck with high thermal conductivity. The deformability is achieved with a thin membrane structure having a layer of dielectric material, a layer of metallic film and a layer of semiconductor material. The high thermal conductivity is achieved by providing a hollow area between a supporting structure and the membrane in which a coolant gas is circulated. The supporting structure also has a hollow area in which a liquid coolant is circulated. The membrane can be attached to the base structure through flexural supports, so it can expand and contract with the wafer, as the latter's temperature changes, thereby avoiding stiction problems.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A vacuum compatible, deformable electrostatic chuck with high thermal conductivity, comprising:
    a supporting structure; and
    a membrane comprising a first layer formed of a dielectric material, a second layer formed of a conductive material and a third layer formed of a substrate material and having a rim formed on a periphery of a surface of the third layer and multiple struts formed on the surface of the third layer, and wherein the membrane is attached to the supporting structure by the rim and the struts providing a hollow area between the membrane and a surface of the supporting structure, and wherein the supporting structure includes multiple gas manifold holes connecting the hollow area between the membrane and a surface of the supporting structure with a source of coolant gas.

2. The vacuum compatible, deformable electrostatic chuck with high thermal conductivity of claim 1 wherein the supporting structure includes a hollow structure, wherein the hollow structure is filled with a liquid coolant.

3. The vacuum compatible, deformable electrostatic chuck with high thermal conductivity of claim 2 wherein the hollow structure includes a top layer of material having a top surface interfacing with the rim and struts of the membrane and having a bottom surface having grooves that interface with the liquid coolant.

4. The vacuum compatible, deformable electrostatic chuck with high thermal conductivity of claim 1 wherein the third layer and struts is etched from a semiconductor wafer.

5. The vacuum compatible, deformable electrostatic chuck with high thermal conductivity of claim 2 wherein the second layer is formed from a conductive material selected from the group consisting of aluminum, titanium, tungsten, and copper.

6. The vacuum compatible, deformable electrostatic chuck with high thermal conductivity of claim 5 wherein the first layer is formed from a dielectric material selected from the group consisting of silicon dioxide, sapphire and an organic polymer.

7. The vacuum compatible, deformable electrostatic chuck with high thermal conductivity of claim 6 wherein the first layer has a thickness in the range of 20–100 $\mu$m.

8. The vacuum compatible, deformable electrostatic chuck with high thermal conductivity of claim 7 wherein the second layer has a thickness of approximately 50 nanometers.

9. The vacuum compatible, deformable electrostatic chuck with high thermal conductivity of claim 8 wherein the third layer has a thickness in the range of 10–20 $\mu$m.

10. The vacuum compatible, deformable electrostatic chuck with high thermal conductivity of claim 1 wherein the multiple struts are formed on the surface of the third layer from a first point of the rim to a second point on the rim.

11. The vacuum compatible, deformable electrostatic chuck with high thermal conductivity of claim 10 wherein the multiple struts have a rectangular cross section.

12. The vacuum compatible, deformable electrostatic chuck with high thermal conductivity of claim 11 wherein the multiple square shaped struts are formed on the surface of the third layer.

13. The vacuum compatible, deformable electrostatic chuck with high thermal conductivity of claim 12 wherein the multiple struts have a first section with a rectangular cross section and a second section in the shape of a truncated cone.

14. The vacuum compatible, deformable electrostatic chuck with high thermal conductivity of claim 12 wherein the multiple struts have a first section with a rectangular cross section and a second section in the shape of a pyramid.

15. An electrostatic chuck comprising:
   a supporting structure including therein multiple gas manifold holes;
   a membrane comprising,
      a first layer formed of dielectric material,
      a second layer formed of conductive material and
      a third layer formed of a substrate material, the third layer having a rim formed on a periphery of a surface of the third layer and multiple struts formed on the surface of the third layer,
   wherein the membrane is attached to the supporting structure by the rim and the struts, and
   wherein the struts define a hollow area between the membrane and a surface of the supporting structure such that the multiple gas manifold holes connect the hollow area between the membrane and a surface of the supporting structure with a source of coolant gas.

16. An electrostatic chuck as in claim 15 wherein the supporting structure includes a hollow structure filled with liquid coolant.

17. An electrostatic chuck as in claim 16 wherein the hollow structure includes a top surface interfacing with the rim and struts of the membrane and including a bottom surface having grooves that interface with the liquid coolant, wherein the grooves are micro-machined into the bottom surface.

* * * * *